United States Patent
Li (10) Patent No.: US 10,320,342 B2
(45) Date of Patent: Jun. 11, 2019

(54) ADVANCED RF INPUT PORT AGAINST SURGE

(71) Applicant: CommScope, Inc. of North Carolina, Hickory, NC (US)

(72) Inventor: Shi Man Li, Mooresville, NC (US)

(73) Assignee: CommScope, Inc. of North Carolina, Hickory, NC (US)

(*) Notice: Subject to any disclaimer, the term of this patent is extended or adjusted under 35 U.S.C. 154(b) by 0 days.

(21) Appl. No.: 15/719,538

(22) Filed: Sep. 28, 2017

(65) Prior Publication Data

US 2018/0102748 A1 Apr. 12, 2018

Related U.S. Application Data

(60) Provisional application No. 62/405,760, filed on Oct. 7, 2016.

(51) Int. Cl.

| | |
|---|---|
| *H03F 1/52* | (2006.01) |
| *H03F 3/19* | (2006.01) |
| *H01P 5/18* | (2006.01) |
| *H01P 1/22* | (2006.01) |
| *H03F 3/62* | (2006.01) |
| *H04B 1/40* | (2015.01) |
| *H04B 1/04* | (2006.01) |

(52) U.S. Cl.
CPC .......... *H03F 1/52* (2013.01); *H01P 1/22* (2013.01); *H01P 5/18* (2013.01); *H03F 3/19* (2013.01); *H03F 3/62* (2013.01); *H03F 2200/426* (2013.01); *H03F 2200/451* (2013.01); *H03F 2200/63* (2013.01); *H04B 1/40* (2013.01); *H04B 2001/0408* (2013.01)

(58) Field of Classification Search
USPC .............................................. 330/298, 207 P
See application file for complete search history.

(56) References Cited

U.S. PATENT DOCUMENTS

| | | |
|---|---|---|
| 5,712,755 A | 1/1998 | Glaser et al. |
| 6,411,487 B1 | 6/2002 | Rawlings et al. |
| 7,530,091 B2 | 5/2009 | Vaughan |
| 7,609,502 B2 | 10/2009 | Kauffman |
| 7,912,431 B2 | 3/2011 | Phillips et al. |

(Continued)

*Primary Examiner* — Hieu P Nguyen
(74) *Attorney, Agent, or Firm* — Muncy, Geissler, Olds & Lowe, P.C.

(57) ABSTRACT

A bi-directional RF signal amplifier includes a RF input port and surge suppression circuitry downstream of the RF input port. First and second communications paths lead from the surge suppression circuitry to first and second RF output ports. The second communications path is considered non-interruptible and can support both downstream and upstream RF communications even in the absence of power being supplied to the RF signal amplifier. The surge suppression circuitry includes a data line connected to the RF input port. A first circuit path is electrically connected between the data line and ground. A gas discharge tube (GDT), within the first circuit path, acts as an open circuit when a voltage across the GDT is less than a predetermined value and acts as a short circuit when the voltage across the GDT exceeds the predetermined voltage. An electronic device is placed in series with the GDT within the first circuit path. The electronic device enables the second communications path of the RF signal amplifier to remain operable even if the GDT fails to a short circuit state due to a breakdown of the gases within the GDT.

20 Claims, 6 Drawing Sheets

(56) References Cited

U.S. PATENT DOCUMENTS

| | | |
|---|---|---|
| 8,228,656 B2 | 7/2012 | Kauffman |
| 8,259,430 B2 | 9/2012 | Alkan |
| 8,441,795 B2 | 5/2013 | Jones et al. |
| 8,576,525 B2 | 11/2013 | Wang |
| 8,854,153 B2 | 10/2014 | Kauffman |
| 8,939,796 B2 | 1/2015 | Darrow et al. |
| 8,971,792 B2 | 3/2015 | Riggsby et al. |
| 9,094,101 B2 | 7/2015 | Li et al. |
| 2006/0205442 A1 | 9/2006 | Phillips et al. |
| 2007/0236853 A1 | 10/2007 | Crawley |
| 2008/0037188 A1 | 2/2008 | Wilson et al. |
| 2011/0085480 A1 | 4/2011 | Kelma et al. |
| 2011/0273845 A1 | 11/2011 | Jones et al. |
| 2013/0321964 A1 | 12/2013 | Miller |
| 2015/0077889 A1 | 3/2015 | Kauffman |
| 2015/0207525 A1 | 7/2015 | Li |
| 2015/0288920 A1 | 10/2015 | Li |

ADVANCED RF INPUT PORT AGAINST SURGE

This application claims the benefit of U.S. Provisional Application No. 62/405,760, filed Oct. 7, 2016, which is herein incorporated by reference.

BACKGROUND OF THE INVENTION

1. Field of the Invention

The present invention is directed to technology for providing non-interruptible communications. More particularly, the present invention relates to surge protection circuitry, which includes features to maintain a communications path after a surge tripping event.

2. Description of the Related Art

In recent years, the rise of the Internet and other online communication methods have rapidly transformed the manner in which electronic communications take place. Today, rather than relying on prior-generation switched telephone communication arrangements, many service providers are turning to modern Internet Protocol (IP) based communication networks, such as Voice-over-Internet Protocol ("VoIP") digital telephone services. Such networks can provide flexibility in facilitating the transmission of voice, data, video, and other information at great speeds.

As a result, many consumers now have the option of conducting telephone conversations, receiving and sending information for interactive video, and communicating over the Internet—all through a single RF connection with the consumer's service provider. However, in order to support these various services, the RF signals received and/or sent from/to the service provider may require amplification by RF amplifier(s) in order to properly service the various communication ports maintained by a consumer. Such RF amplifiers often include advanced features like supporting Multimedia Over Coax Alliance ("MoCA") communications between connected devices within a home, a business or similar facility. Such RF amplifiers and similar communication facilitating devices, hereinafter referred to as communications devices, require power to operate.

In many cases, the above-referenced IP communications networks may comprise cable television networks that are used to transmit cable television signals and other information between a service provider and a plurality of subscribers, typically over coaxial cable for at least the drop cable to the customer's home or business premises. Typically, the service provider is a cable television company that may offer, among other things, cable television, broadband Internet and Voice-over-Internet Protocol ("VoIP") digital telephone service to subscribers within a particular geographic area. A subscriber may receive all of these services through a single radio frequency ("RF") connection between the service provider and the subscriber premises. The service provider may transmit both "downstream" signals (which are also sometimes referred to as "forward path" signals) from the headend facilities of the cable television network to the subscriber premises and "upstream" signals (which are also sometimes referred to as "reverse path" signals) from the individual subscriber premises back to the headend facilities. The downstream signals are currently transmitted in the 54-1002 MHz frequency band, and may include, for example, different tiers of cable television channels, movies on demand, digital telephone and/or Internet service (the signals received by the subscriber), and other broadcast or point-to-point offerings. The upstream signals are currently transmitted in the 5-42 MHz frequency band and may include, for example, signals associated with digital telephone and/or Internet service (the signals transmitted by the subscriber) and ordering commands (i.e., for movies-on-demand and other services).

In many cases, significant attenuation may occur as signals are passed through the cable television network, and hence the power level of the RF signal that is received at a subscriber premises may be on the order of 0-5 dBmV/channel. Such received signal levels may be insufficient to support the various services at an acceptable quality of service level. Accordingly, RF signal amplifiers may be provided at or near individual subscriber premises that are used to amplify the downstream RF signals to a more useful level. The RF signal amplifier may also be configured to amplify the upstream RF signals that are transmitted from the subscriber premises to the headend facilities of the cable television network.

Unfortunately, RF signal amplifiers comprise active devices that require a power feed for proper operation. Accordingly, if power to an RF signal amplifier is interrupted, some or all of the communications between the service provider and the subscriber premises may be lost. Although such interruptions may be tolerated in relation to certain non-essential services, interruptions to other services may be unacceptable. For example, subscribers relying on IP-based emergency communications (i.e., 911 service) can be left without such services during power interruptions.

In order to remedy this problem, some subscribers may be inclined to acquire a dedicated switched telephone line to provide emergency services during power interruptions. Nevertheless, such an option can require the subscriber to incur additional costs, and fails to capitalize on the advantages offered by IP-based communications.

To address the concern of interrupted telephone services during a power outage, the Assignee of the present invention has provided a communications device that has at least one non-interruptible communications port for maintaining communications in the event of a power failure. Examples of such communications devices can be found in the Assignee's U.S. Pat. Nos. 7,912,431; 8,971,792; 9,094,101 and 9,699,516, each of which is herein incorporated by reference. US Published Application Nos. 2011/0085480 and 2007/0236853 also show communications devices with a passive communications path, which can function during a power outage and are herein incorporated by reference.

In accordance with the referenced patents, above, a RF signal amplifier receives a composite downstream RF signal of approximately 5 dBmV/channel in the range of approximately 54-1002 MHz comprising information for telephone, cable television (CATV), Internet, VoIP, and/or data communications from a service provider. The RF signal amplifier may increase this downstream signal to a more useful level of approximately 20 dBmV/channel and pass the amplified downstream signal to one or more devices in communication with the RF signal amplifier through various RF output ports. Such devices may include, but need not be limited to: televisions, modems, telephones, computers, and/or other communications devices known in the art. In the event of power failure, unamplified signals may still be passed (in both directions) through a communications path between the service provider and at least one communications device.

Figure 1:
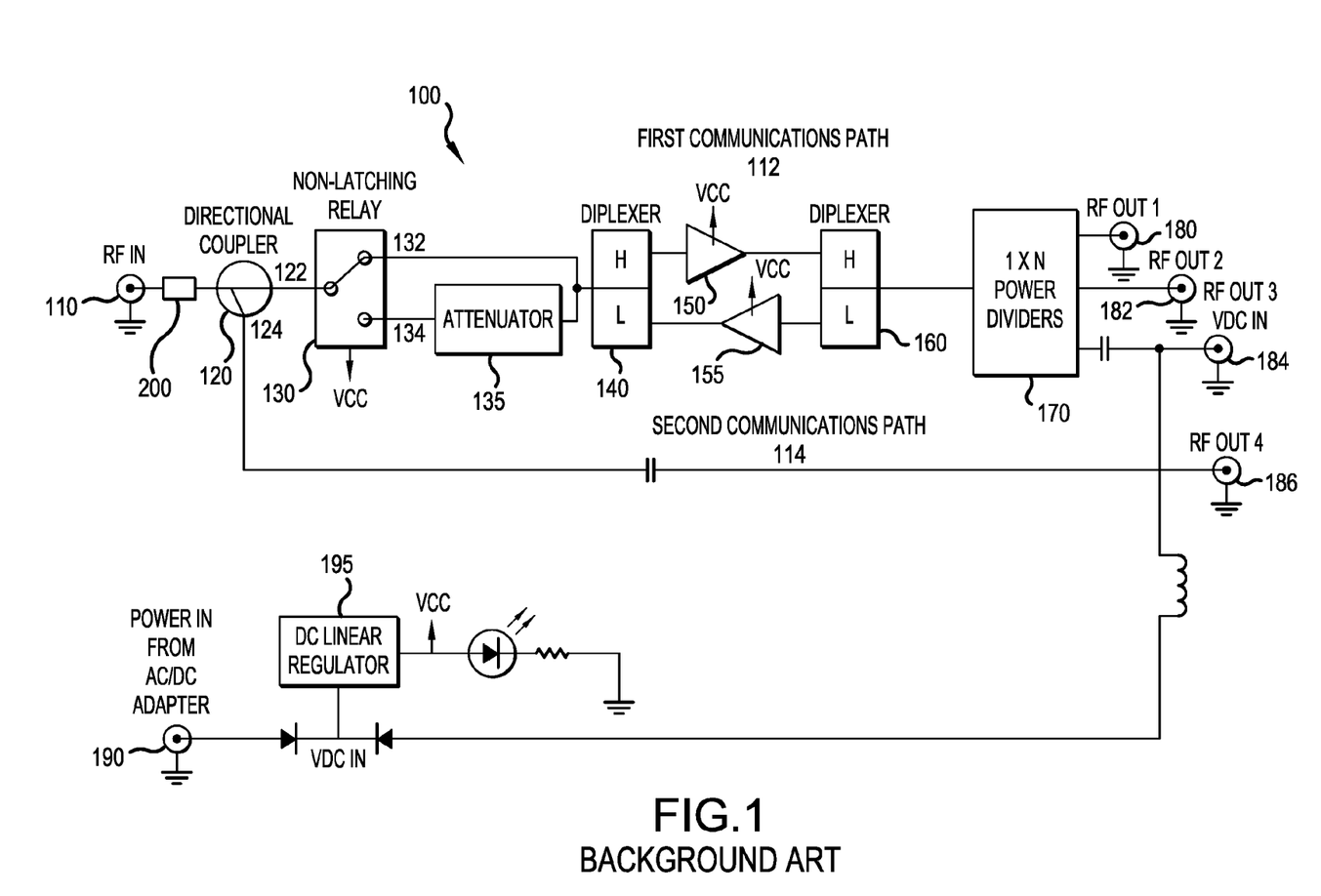
FIG. 1 is a block diagram of a bi-directional RF signal amplifier, according to the background art.

FIG. 1 illustrates a block diagram of a bi-directional RF signal amplifier 100 according to the background art. RF signal amplifier 100 includes three RF output ports 180, 182, 184 that may be used to pass downstream and upstream signals between a service provider and multiple communications devices located in the subscriber premises when the RF signal amplifier 100 is powered and operating normally. Moreover, RF signal amplifier 100 further includes a fourth non-interruptible RF output port 186 that may be used to maintain bi-directional RF communications even during power outages.

As shown in FIG. 1, RF signal amplifier 100 includes a bi-directional RF input port 110 for receiving downstream RF signals from a service provider, or any other appropriate signal source. RF input port 110 can also pass upstream signals in the reverse direction from the RF signal amplifier 100 to the service provider. Due to the bi-directional nature of communications through RF signal amplifiers, it will be appreciated that an "input" port will act as an "output" port and an "output" port will act as an "input" port if the direction of signal flow is reversed. Consequently, it will be appreciated that the terms "input" and "output" are used herein solely for purposes of distinguishing various ports from one another, and are not used to require a direction of signal flow.

As noted above, RF signal amplifier 100 further includes a plurality of bi-directional output ports 180, 182, 184 and 186 that may be used to pass downstream RF signals from the RF signal amplifier 100 to one or more devices in communication with the output ports 180, 182, 184 and 186, and to receive upstream RF signals from those devices so that they may be passed through the RF signal amplifier 100 to the service provider. It will be appreciated that any appropriate device that may advantageously send and/or receive an RF signal may be placed in communication with one or more of the various output ports 180, 182, 184 and 186. For example, it is contemplated that telephone, CATV, Internet, VoIP, and/or data communications devices may be placed in such communication with a service provider where the RF signal amplifier 100 is installed in the residence of a subscriber. However, it will further be appreciated that any desired combination of these and/or other devices may be used where appropriate.

Signals received through RF input port 110 can be passed through RF signal amplifier 100 via a first communications path 112 that extends between RF input port 110 and RF output ports 180, 182, and/or 184. Specifically, the downstream signals that are received at RF input port 110 from the service provider are passed through surge suppression circuitry 200 to a passive directional coupler 120 that has a first output port 122 that connects to the first communications path 112 and a second output port 124 that connects to a second communications path 114. The directional coupler 120 splits downstream RF signals onto the first communications path 112 and the second communications path 114. It will be appreciated that the directional coupler 120 may either evenly or unevenly split the power of the downstream signals between the first and second communications paths 112 and 114, depending on the design of the overall circuit. The first communications path 112 may comprise an "active" communications path that amplifies at least one of downstream signals from the service provider to the subscriber premises or upstream signals from the subscriber premises to the service provider. The second communications path 114 may comprise a passive "non-interruptible" communications path that has no active components thereon, which allows downstream and/or upstream signals to traverse the second communications path 114 even if a power supply to the RF signal amplifier 100 is interrupted.

In some embodiments, the second communications path 114 may provide a communications path for VoIP telephone service that will operate even during power outages at the subscriber premises (assuming that the modem and/or telephone, as necessary, are powered by a battery backup unit).

As is further shown in FIG. 1, downstream signals traversing the first communications path 112 pass from the first output 122 of directional coupler 120 to an input port of a switching device such as, for example, an SPDT non-latching relay 130. A first output 132 of the relay 130 is connected to an input of a first, high/low diplexer 140. A second output 134 of the relay 130 is connected to an attenuator 135. The attenuator 135 may take the form of a 75 ohm resistor connected between the second output 134 and ground, or between the second output 134 and the first diplexer 140 (as illustrated).

The first diplexer 140 separates the high frequency downstream signal from any low frequency upstream signals incident in the reverse direction. In various embodiments, the first diplexer 140 can filter the signals in a manner such that signals with frequencies greater than approximately 45-50 MHz are passed as high frequency downstream signals, while signals with frequencies lower than such range are passed in the reverse direction as low frequency upstream signals received from ports 180, 182 and/or 184. It will be appreciated, however, that other diplexer designs may be utilized.

The high frequency downstream signals filtered by the first diplexer 140 can be amplified by a downstream individual power amplifier 150, and passed through a second high/low diplexer 160 to a network of power dividers 170. The power dividers 170 may further split the downstream signal so that it may be distributed to each of RF output ports 180, 182 and 184. While the power divider network 170 illustrated in FIG. 1 splits the downstream signals for distribution to three different RF output ports, it will be appreciated that the power divider network 170 may split the downstream signals for distribution to different numbers of RF output ports (e.g., four, eight, etc.), or may alternatively be omitted in situations where only a single RF output port is needed.

Turning now to the reverse (upstream) signal flow through the first communications path 112 of RF signal amplifier 100, upstream signals received by the RF signal amplifier 100 from devices in communication with ports 180, 182 and/or 184 are passed to power dividers 170 where they are combined into a composite upstream signal. This composite upstream signal is fed through the second diplexer 160 for separating the low frequency composite upstream signal from any high frequency downstream signals incident in the forward direction. As previously discussed in relation to the first diplexer 140, the second diplexer 160 can filter the signals such that signals with frequencies greater than approximately 45-50 MHz are passed in the forward direction as high frequency downstream signals, while signals with frequencies lower than such range are passed in the reverse direction as low frequency upstream signals received from ports 180, 182 and/or 184.

The composite low frequency upstream signal filtered by the second diplexer 160 can be passed directly to the first high/low diplexer 140 (or optionally the upstream signal filtered by the second diplexer 160 can pass through an upstream power amplifier 155 prior to reaching the first diplexer 140), where it is then passed through the first output port 132 of the relay 130 to the first output port 122 of the directional coupler 120. The directional coupler 120 combines the upstream signal received at output port 122 with any upstream signal received at output port 124 and passes this combined signal through the surge suppression circuitry 200 to the RF input port 110 for output to a service provider or other entity in communication with RF input port 110.

The downstream and upstream power amplifiers 150 and 155 that are included on the first communications path 112 are active devices that must be powered via a power source, such as a DC linear regulator that outputs a power supply voltage VCC. During normal operation, the RF signal amplifier 100 can be powered from a power input port 190 and/or power that is reverse fed through one of the RF output ports (e.g., output port 184, which is labeled RF OUT 3/VDC IN). In a typical installation at a subscriber premises, it is contemplated that RF signal amplifier 100 may be powered by an AC/DC adapter receiving power provided by the residence (for example, 100-230 VAC, 50/60 Hz). As illustrated in FIG. 1, the power received from either power input 190 or power input 184 may be provided to a voltage regulator 195 which supplies an operating voltage VCC to the power amplifier 150.

In the event that power to voltage regulator 195 is interrupted, voltage regulator 195 will be unable to provide operating voltage VCC to the downstream and upstream power amplifiers 150 and 155. Consequently, during power outages, the downstream portion (and also the upstream portion, if the upstream power amplifier 155 is employed) of the first communications path 112 will be lost.

As noted above, RF signal amplifier 100 also has the second communications path 114 that extends from the second output 124 of the directional coupler 120 to the RF output port 186. This second communications path 114 bypasses the downstream and upstream power amplifiers 150 and 155 and does not include any active components; consequently, the second communications path 114 will remain available to pass communications between RF input port 110 and RF output port 186, even when the power supply to RF signal amplifier 100 is interrupted. Accordingly, the second communications path 114 is also referred to herein as a "non-interruptible" communications path. The second communications path 114 may be used to maintain essential services to the subscriber premises such as, for example, 911 emergency lifeline services, even during power outages, so long as the subscriber has a battery backup for the necessary devices connected to RF output port 186.

As shown in FIG. 1, the surge suppression circuitry 200 is provided immediately downstream of the RF input port 110. The surge suppression circuitry 200 assists in protecting the RF signal amplifier 100 and consumer devices directly wired to RF output ports 180, 182, 184 and 186 from damage due to electrical surges traveling downstream along the medium entering the RF input port 110. The medium is typically a coaxial cable, but may take the form of other mediums, like a twisted pair cable or a hybrid cable, which includes both fibers and electrical wires. Surge suppression circuitries are described in varying levels of detail in US Published Application Nos. 2011/0085480 and 2008/0037188, as well as U.S. Pat. No. 8,259,430, each of which is herein incorporated by reference.

Figure 2:
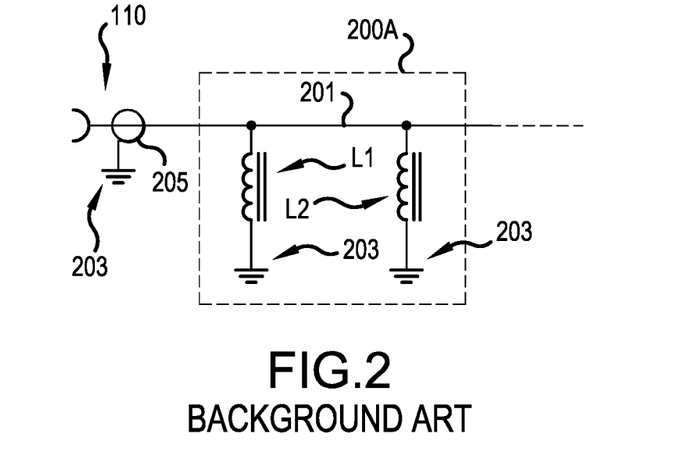
FIG. 2 is a block diagram of a first embodiment of surge suppression circuitry found in FIG. 1.
Figure 3:
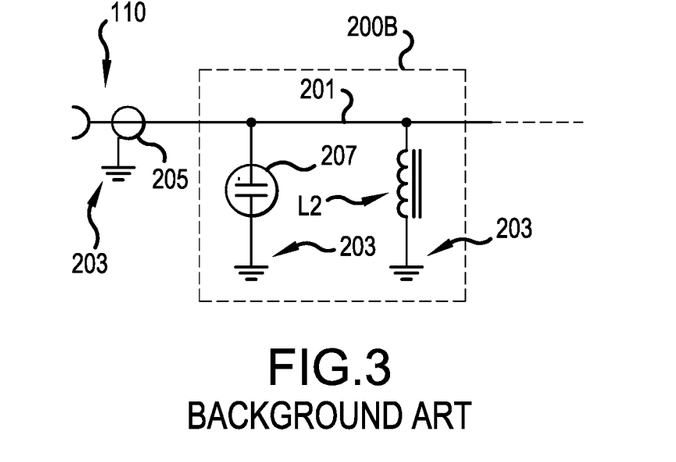
FIG. 3 is a block diagram of a second embodiment of surge suppression circuitry found in FIG. 1.

FIGS. 2 and 3 depict first and second alternatives for surge suppression circuitries 200A and 200B at the RF input port 110 of the RF signal amplifier 100, as known in the background art. In the first surge suppression circuitry 200A of FIG. 2, first and second RF chokes L1 and L2, which may be formed as inductors or coils of wire wrapped about a core, are provided immediately downstream of the RF input port 110 to the RF signal amplifier 100. A data line or input line 201 may be considered the contact in the RF input port 110 which makes electrical contact to the center conductor of a coaxial cable mated to the RF input port 110. A ground 203 may be considered to be electrically connected to the screw threads 205 of the RF input port 110, which are electrically connected to the shielding layer of the coaxial cable mated to the RF input port 110. The ground 203 may also be connected to another wire actually connected to a well-established ground, like a rod driven into the earth.

In the second surge suppression circuitry 200B of FIG. 3, a gas discharge tube (GDT) 207 replaces one of the RF chokes L1 or L2. The GDT 207 is a sealed glass-enclosed device containing a special gas mixture, e.g., a plasma, trapped between two electrodes, which conducts electric current after becoming ionized by a high voltage transient. The GDT 207 can conduct a large amount of current and hence is a preferred device to employ in the surge suppression circuitry 200.

Unfortunately, the GDT 207 has a finite life expectancy. The GDT 207 can handle a few high voltage transients or a greater number of smaller voltage transients. The GDT 207 creates an effective short circuit when triggered, so that the voltage spike on the input line 201 is shorted to the ground 203. The shorting of the voltage spike from the input line 201 to the ground 203 is intended to prevent damage to the RF signal amplifier 100 and/or the consumer equipment attached to the RF output ports 180, 182, 184 and 186. Once triggered, the GDT 207 will continue conducting as a short circuit (called follow-on current) until all electric current sufficiently diminishes, and the gas discharge within the GDT 207 quenches. Once, quenched, the GDT 207 returns to an open circuit, and the signal from the input line 201 once again may continue to the directional coupler 120 for processing, e.g., television programming, Internet services, telephone services or VoIP service, resume to a functional status.

Once the GDT 207 reaches its full life cycle, the GDT 207 becomes a short circuit and effectively connects the input line 201 to the ground 203. The GDT 207 becomes a short circuit because the gas within the GDT 207 breaks down and changes. Often times, the color of the gas within the GDT 207 will change, e.g., darken, when the GDT 207 reaches the end of its useful life and becomes a permanent short circuit.

Additional background art can be found in U.S. Pat. Nos. 7,530,091 and 8,576,525, and in US Published Applications 2006/0205442 and 2015/0288920, which are herein incorporated by reference.

SUMMARY OF THE INVENTION

The Applicant has appreciated some drawbacks in the surge suppression circuitry for a RF signal amplifier in accordance with background art. In the case of the surge suppression circuitry of FIG. 3, the GDT 207 will become a short circuit upon failure. The failure of the GDT 207 may be caused by several small power surges or one large power surge. However, once the GDT 207 fails, an effective short circuit is created between the input line 201 and the ground 203. Once the short circuit between the input line 201 and the ground 203 is established the RF signal amplifier 100 ceases to operate. More importantly, the passive, second communications path 114, which allowed VoIP services to continue during a power outage also ceases to operate. This creates a problem, as customers want their telephone service to continue during emergency situations, and often times, a power surge may be caused by a lightning strike during a storm. Therefore, a customer's telephone service may be disrupted during a storm when emergency services are needed.

It is an object of the present invention to provide improved surge suppression circuitry for the RF signal amplifier, which addresses one or more of the drawbacks appreciated by the Applicant.

These and other objects are accomplished by a bi-directional RF signal amplifier which includes a RF input port and surge suppression circuitry downstream of the RF input port. First and second communications paths lead from the surge suppression circuitry to first and second RF output ports. The second communications path is considered non-interruptible and can support both downstream and upstream RF communications even in the absence of power being supplied to the amplifier. The surge suppression circuitry includes a data line connected to the RF input port. A first circuit path is electrically connected between the data line and ground. A gas discharge tube (GDT), within the first circuit path, acts as an open circuit when a voltage across the GDT is less than a predetermined value and acts as a short circuit when the voltage across the GDT exceeds the predetermined voltage. An electronic device is placed in series with the GDT within the first circuit path. The electronic device enables the second communications path to remain operable even if the GDT fails to a short circuit state due to a breakdown of the gases within the GDT.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 4:
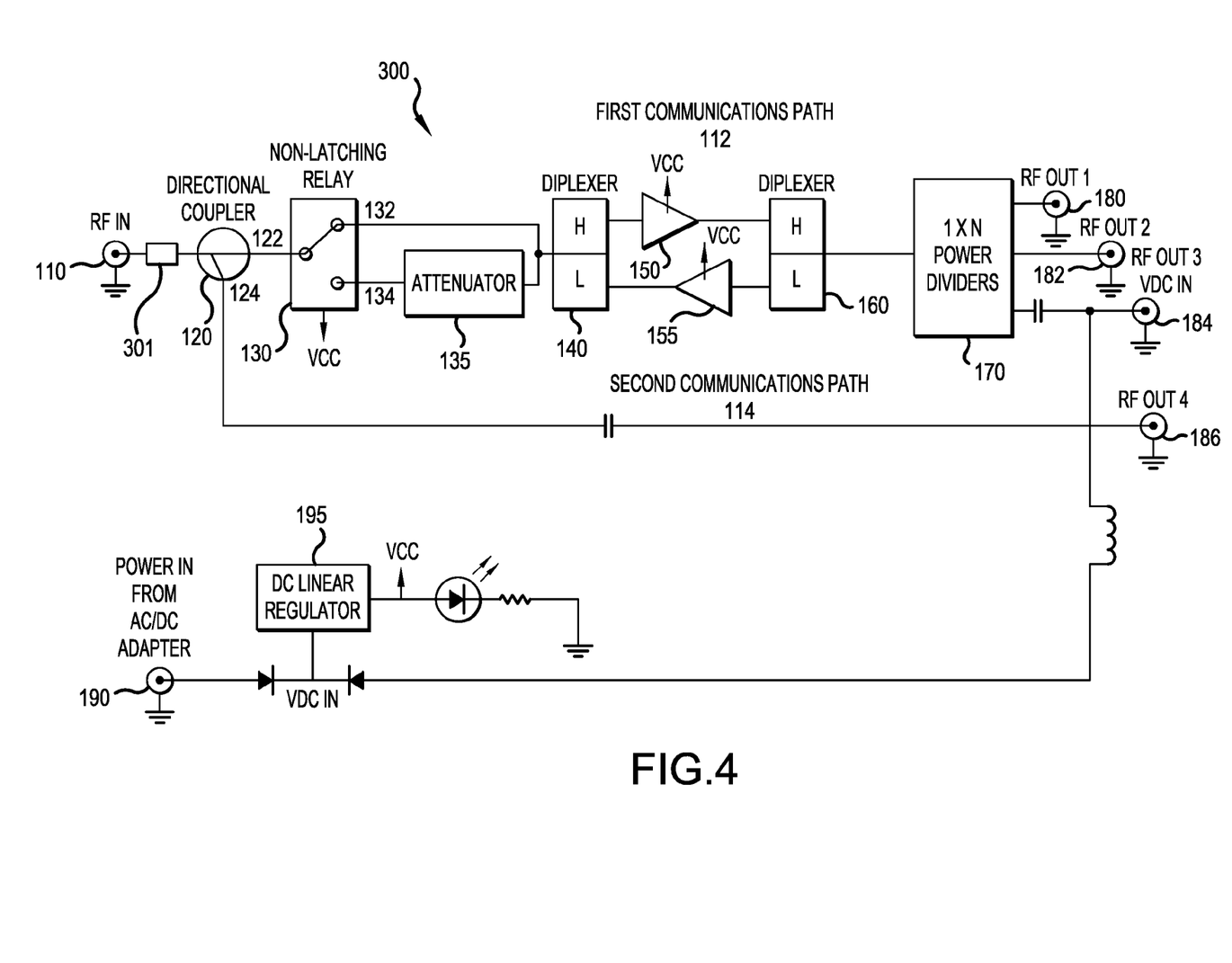
FIG. 4 is a block diagram of a bi-directional RF signal amplifier, according to the present invention.

FIG. 4 is a block diagram of a bi-directional RF signal amplifier 300, according to the present invention. The RF signal amplifier 300 has all of the same components as described above regarding FIG. 1, except for new power surge suppression circuitry 301. Detailed information about the parts of the RF signal amplifier 300, besides the power surge suppression circuitry 301, may also be had by referring to the prior art references previously incorporated by reference.

Figure 5:
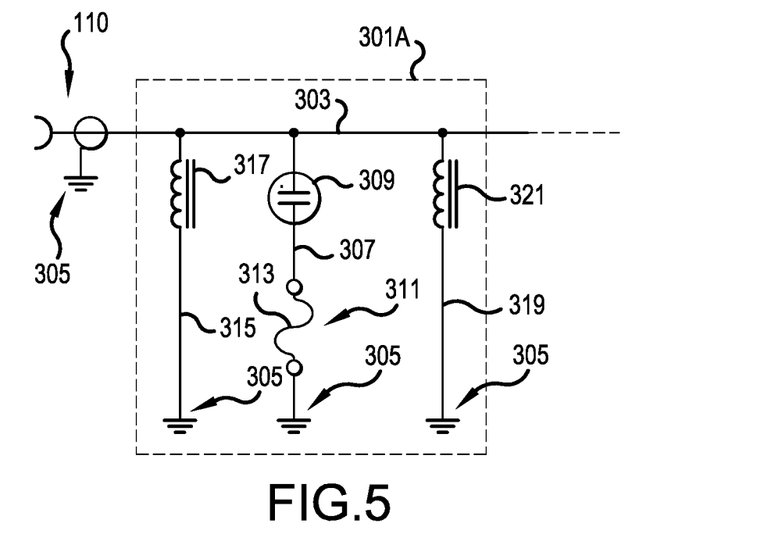
FIG. 5 is a block diagram of a first embodiment of surge suppression circuitry found in FIG. 4.

FIG. 5 is a block diagram of a first embodiment 301A of the surge suppression circuitry 301, depicted in FIG. 4. The first embodiment 301A includes a data line 303 within a communications device, such as the RF input port 110 of the RF signal amplifier 300, and also includes a ground 305. In one embodiment, the data line 303 connects to the terminal of RF input port 110, which communicates with a center conductor of a coaxial cable mated to the RF input port 110, while the ground 305 is connected to the terminal, e.g., the screw threads, of the RF input port 110, which communicates with the shielding layer of the coaxial cable.

A first circuit path 307 is electrically connected between the data line 303 and the ground 305. A gas discharge tube (GDT) 309 is located within the first circuit path 307. The GDT 309 acts as an open circuit when a voltage across the GDT 309 is less than a predetermined value and acts as a short circuit when a transient voltage across the GDT 309 exceeds the predetermined voltage. For example, a GDT 309 may be selected to activate upon encountering a transient voltage in the 100V/µs to 1 KV/µs range, such as the surface mounted "Heavy Duty Gas Discharge Tube Surge Arrestor" sold by BOURNS® under their model numbers 2029-xx-SMLF.

An electronic device 311 is placed in series with the GDT 309 within the first circuit path 307. In the embodiment of FIG. 5, the electronic device 311 is a fuse 313. The fuse 313 is designed to blow and form an open circuit just as, or just before, a failure of the GDT 309 to a permanent short circuit state. By blowing the fuse 313, the GDT 309 will no longer short the data line 303 to the ground 305. Consequently, the first circuit path 307 will no longer be able to suppress power surges. To restore the first circuit path 307, the amplifier 300 would need to be repaired by replacing the GDT 309 and replacing the fuse 313.

Although a fuse 313 has been illustrated in FIG. 5, other types of devices may be substituted to perform the same function. For example, a circuit breaker may be used. A resistor, designed to burn out and become an open circuit upon a predetermined occurrence, may be used. A thin wire, designed to burn through and become an open circuit upon a predetermined occurrence, may be used, as well as other types of electrical devices.

The first embodiment 301A of FIG. 5 does include a second circuit path 315 electrically connected between the data line 303 and the ground 305. The second circuit path 315 is considered to be in parallel to the first circuit path 307. The second circuit path 315 includes a first radio frequency (RF) choke 317 acting to suppress a power surge on the data line 303. The second circuit path 315 would continue to provide power surge protection even after the first circuit path 307 ceases to operate.

Further, the first embodiment 301A of FIG. 5 may optionally include a third circuit path 319 electrically connected between the data line 303 and the ground 305. The third circuit path 319 is considered to be in parallel to the first circuit path 307 and in parallel to the second circuit path 315.

The third circuit path 319 includes a second RF choke 321 acting to suppress a power surge on the data line 303. Like the second circuit path 307, the third circuit path 319 would continue to provide power surge protection even after the first circuit path 307 ceases to operate. Even with a failed first circuit path 307, the combination of the second and third circuit paths 315 and 319 are approximately equal to the surge protection provided by the arrangement shown in FIG. 2 of the background art. Of course, additional RF chokes may be added in additional circuit paths to the first embodiment 301A, as well as the further embodiments to be described below if additional surge suppression is desired.

Although FIG. 5 has shown the first circuit path 307 being located between the second and third circuit paths 315 and 319, the first embodiment 301A may have the ordering altered. For example, the second and third circuit paths 315 and 319 may be located "upstream" or closer to the RF input port 110, than the first circuit path 307. Also, the first circuit path 307 may be located upstream relative to the second and third circuit paths 315 and 319. However, in a preferred embodiment, at least one of the second and third circuit paths 315 and 319 will be placed upstream of the first circuit path 307. In so doing, the lifespan of the GDT 309 may be increased or prolonged, as the first and/or second RF chokes 317 and 321 will take the initial impacts of power surges and will to some extent lessen the intensity and/or duration of the power surges handled by the GDT 309.

Figure 6:
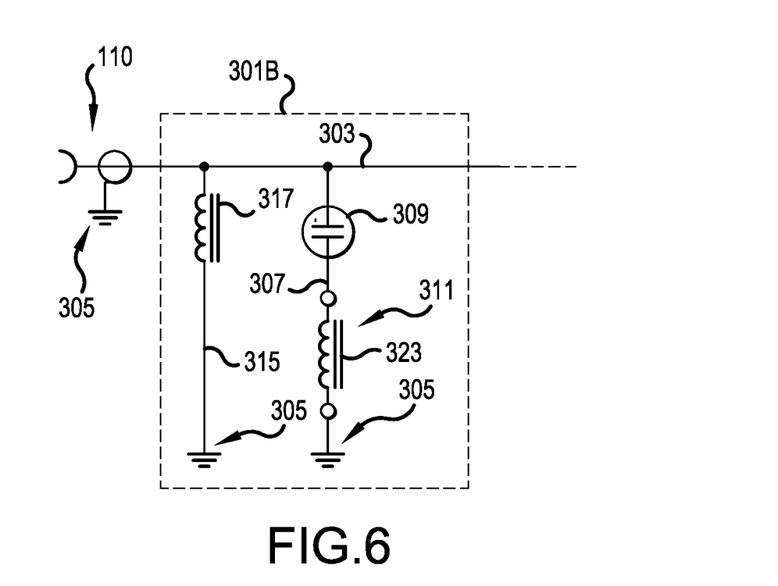
FIG. 6 is a block diagram of a second embodiment of surge suppression circuitry found in FIG. 4.

FIG. 6 is a block diagram of a second embodiment 301B of the surge suppression circuitry 301, depicted in FIG. 4. The second embodiment 301B includes many of the same elements as depicted in FIG. 5, and the same elements have been labeled by the same reference numerals.

The primary difference in the second embodiment 301B is that the third circuit path 319 is not used, and that the electronic device 311 is a backup RF choke 323. The backup RF choke 323 only acts to suppress power surges on the data line 303 when the GDT 309 is acting to suppress a power surge. This is because the GDT 309 forms a short circuit when a power surge is present and hence the backup RF choke 323 becomes effectively connected between the data line 303 and the ground 305 at that point.

If the GDT 309 fails, due to a substantial power surge or repeated smaller power surges, it will become a permanent short circuit. At that point, the first circuit path 307 resembles the third circuit path 319 of FIG. 5. Hence, after a failure of the GDT 309, the surge protection offered by the second embodiment 301B becomes approximately equal to the surge protection provided by the arrangement shown in FIG. 2 of the background art.

Figure 7:
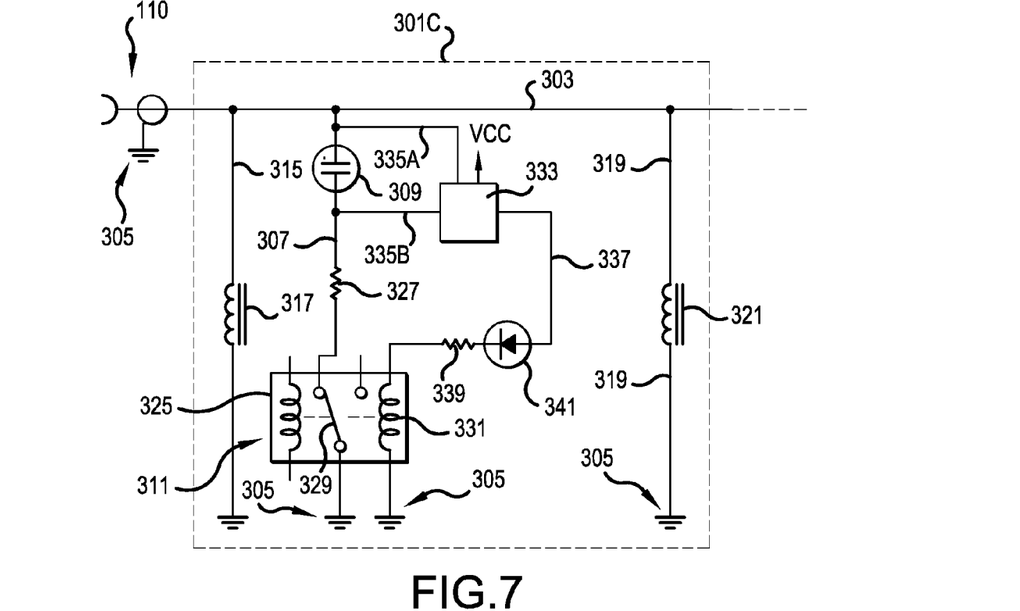
FIG. 7 is a block diagram of a third embodiment of surge suppression circuitry found in FIG. 4 while in a first state.

FIG. 7 is a block diagram of a third embodiment 301C of the surge suppression circuitry 301, depicted in FIG. 4. The third embodiment 301C includes many of the same elements as depicted in FIG. 5, and the same elements have been labeled by the same reference numerals.

The primary difference in the third embodiment 301C, as compared to the first embodiment 301A, is that the electronic device 311 is a different type of disconnection device to create an open circuit condition in the first circuit path 307. In one embodiment, the disconnection device is a relay 325 in series with a resistor 327. The relay 325 has two stable states, with a first stable state (depicted in FIG. 7) connecting the GDT 309 to the ground 305. The second stable state (depicted in FIG. 8) disconnects the GDT 309 from the ground 305.

Within the relay 325 is a contact 329. The contact 329 is bi-stable and can rest in either a first position (FIG. 7) without power being supplied to the relay 325 or a second position (FIG. 8) without power being supplied to the relay 325. If power is supplied to coil 331 of the relay 325, the contact 329 moves from the first position (FIG. 7) to the second position (FIG. 8) in the direction of arrow A. Once the contact 329 is in the second position, the relay 325 is in the second state and the GDT 309 is disconnected from the ground 305. Although the disconnection device is depicted as a relay 325, other types of switching devices may be substituted, such as one or more switching transistors, which allow a current path through the transistors to exist so long as a sufficient gate voltage is applied to the transistors.

A monitoring device, such as controller 333, is used to energize the coil 331. The controller 333 monitors the GDT 309 using input leads 335A and 335B. The input leads 335A and 335B are connected to the terminals of the GDT 309 and allow the controller 333 to determine if the GDT 309 has been in a short circuit state for longer than a predetermined period of time, indicative of a failure of the GDT 309. If the controller 333 determines that the GDT 309 has failed and gone into a permanent short circuit state, the controller 333 energizes the coil 331 via output line 337. The controller 333 may be implemented by a microprocessor or by dedicated circuitry elements configured to perform the sampling function and to energize the output line 337. A resistor 339 and a fault indicator 341 may be connected in series along output line 337, so that the fault indicator 341 is activated when the coil 331 is energized.

Figure 8:
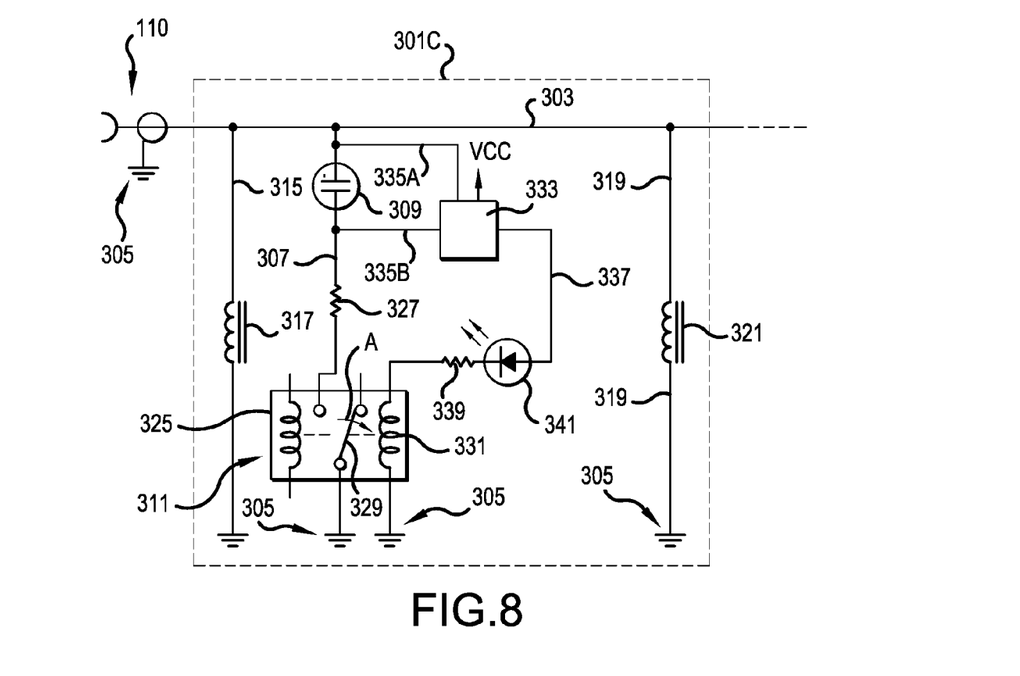
FIG. 8 is a block diagram of the third embodiment of surge suppression circuitry while in a second state.

In the second state of the third embodiment 301C, as depicted in FIG. 8, the fault indicator 341 is shown as an LED and the LED is illuminated. Illumination of the fault indicator 341 is a signal to the consumer that the GDT 309 is defective and that the RF signal amplifier 300 will need to be serviced soon. Although the fault indicator 341 is shown as an LED, it could be any other type of device to provide a visual indication, e.g., an LCD display, or any type of device to make a sound indication, e.g., an intermittently sounding buzzer or beeper.

Figure 9:
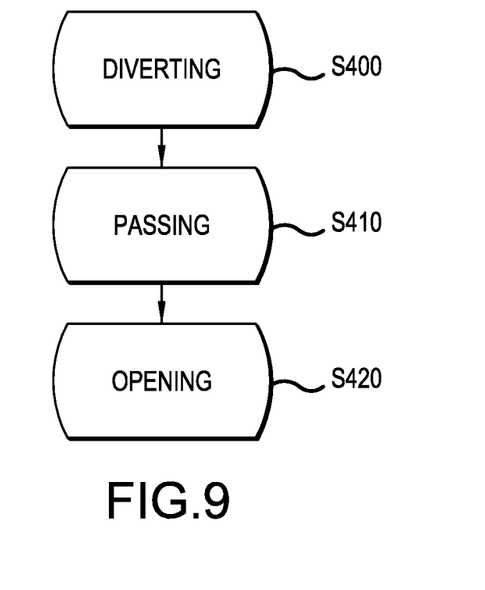
FIG. 9 is a flowchart illustrating a first method, in accordance with the present invention.

The present invention also provides a first method of suppressing power surges entering a communications device as shown in the flowchart of FIG. 9. The method includes the steps of diverting (S400) a power surge from a data line through a first circuit path including a gas discharge tube to a ground. Passing (S410) the power surge through the first circuit path until a failure of the gas discharge tube, or just prior to a failure of the gas discharge tube. Then, opening (S420) the first circuit path to stop an electrical connection between the data line and the ground.

Figure 10:
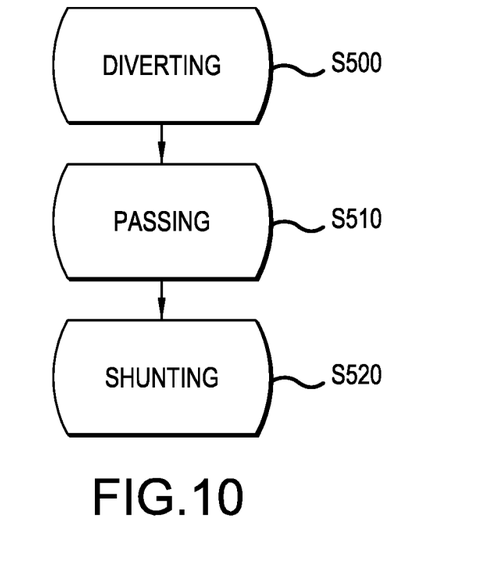
FIG. 10 is a flowchart illustrating a second method, in accordance with the present invention.

The present invention also provides a second method of suppressing power surges entering a communications device as shown in the flowchart of FIG. 10. The second method includes the steps of diverting (S500) a power surge from a data line onto a first circuit path. Passing (S510) the power surge through a series connection of a gas discharge tube and a radio frequency choke. Then, shunting (S520) the power surge to ground.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. Power surge suppression circuitry for a bi-directional RF signal amplifier, said circuitry comprising:
   a data line connected to a RF input port;
   a ground;
   a first circuit path electrically connected between said data line and said ground;
   a gas discharge tube within said first circuit path, which acts as an open circuit when a voltage across said gas discharge tube is less than a predetermined value and which acts as a short circuit when the voltage across said gas discharge tube exceeds the predetermined voltage; and
   an electronic device in series with said gas discharge tube within said first circuit path, wherein said electronic device is a disconnection device to create an open circuit condition in said first circuit path, wherein said disconnection device is a relay, and wherein said relay has two stable states, with a first stable state connecting said gas discharge tube to said ground and a second stable state which disconnects said gas discharge tube from said ground.

2. The circuitry of claim 1, further comprising:
   an indicator to signal when said gas discharge tube is defective and can no longer operate as an open circuit.

3. The circuitry of claim 1, wherein a coil is energized by a controller to change said relay from said first stable state to said second stable state, and wherein said controller energizes said coil when it is determined by said controller that said gas discharge tube has been in a short circuit state for longer than a predetermined period of time.

4. The circuitry of claim 3, further comprising a fault indicator electrically connected to said controller, so that said fault indicator is activated when said coil is energized.

5. The circuitry of claim 1, further comprising:
   a second circuit path electrically connected between said data line and said ground, so that said second circuit path is in parallel to said first circuit path, and wherein said second circuit path includes a first radio frequency (RF) choke acting to suppress a power surge on said data line.

6. The circuitry of claim 5, further comprising:
   a third circuit path electrically connected between said data line and said ground, so that said third circuit path is in parallel to said first circuit path and in parallel to said second circuit path, and wherein said third circuit path includes a second RF choke acting to suppress a power surge on said data line.

7. The circuitry of claim 3, further comprising:
   a second circuit path electrically connected between said data line and said ground, so that said second circuit path is in parallel to said first circuit path, and wherein said second circuit path includes a first radio frequency (RF) choke acting to suppress a power surge on said data line.

8. The circuitry of claim 7, further comprising:
   a third circuit path electrically connected between said data line and said ground, so that said third circuit path is in parallel to said first circuit path and in parallel to said second circuit path, and wherein said third circuit path includes a second RF choke acting to suppress a power surge on said data line.

9. The circuitry of claim 4, further comprising:
   a second circuit path electrically connected between said data line and said ground, so that said second circuit path is in parallel to said first circuit path, and wherein said second circuit path includes a first radio frequency (RF) choke acting to suppress a power surge on said data line.

10. The circuitry of claim 9, further comprising:
    a third circuit path electrically connected between said data line and said ground, so that said third circuit path is in parallel to said first circuit path and in parallel to said second circuit path, and wherein said third circuit path includes a second RF choke acting to suppress a power surge on said data line.

11. A bi-directional RF signal amplifier, comprising:
a power regulation circuit that is configured to generate a power supply voltage in response to power received from an external source;
an RF input port;
power surge suppression circuitry connected to said RF input port;
a first RF output port;
a second RF output port;
a first communications path that extends between said RF input port and said first RF output port, said first communications path including a power amplifier that is configured to amplify downstream signals passing from said RF input port to said first RF output port; and
a second, non-interruptible communications path that extends between said RF input port and said second RF output port, wherein said second, non-interruptible communications path is configured to support both downstream and upstream RF communications even in the absence of power from the external source;
wherein said power surge suppression circuitry includes:
a data line connected to said RF input port;
a ground;
a first circuit path electrically connected between said data line and said ground;
a gas discharge tube within said first circuit path, which acts as an open circuit when a voltage across said gas discharge tube is less than a predetermined value and which acts as an short circuit when the voltage across said gas discharge tube exceeds the predetermined voltage; and
an electronic device in series with said gas discharge tube within said first circuit path, wherein said electronic device is a disconnection device to create an open circuit condition in said first circuit path, wherein said disconnection device is a relay, and wherein said relay has two stable states, with a first stable state connecting said gas discharge tube to said ground and a second stable state which disconnects said gas discharge tube from said ground.

12. The RF signal amplifier of claim 11, further comprising:
a directional coupler having an input that is coupled to said power surge suppression circuitry, a first output that is coupled to said first communications path and a second output that is coupled to said second, non-interruptible communications path;
a switching device that is coupled said first output of said directional coupler which can selective connect said first output of said directional coupler to a first output or a second output, wherein said second output is connected to an attenuator; and
a first diplexer that is coupled between said first output of said switching device and said first RF output port; and
a second diplexer that is coupled between said first diplexer and said first RF output port, wherein said power amplifier is coupled between said first and second diplexers.

13. The RF signal amplifier of claim 11, wherein a coil is energized by a controller to change said relay from said first stable state to said second stable state, and wherein said controller energizes said coil when it is determined by said controller that said gas discharge tube has been in a short circuit state for longer than a predetermined period of time.

14. The RF signal amplifier of claim 13, further comprising a fault indicator electrically connected to said controller, so that said fault indicator is activated when said coil is energized.

15. The RF signal amplifier of claim 11, further comprising:
a second circuit path electrically connected between said data line and said ground, so that said second circuit path is in parallel to said first circuit path, and wherein said second circuit path includes a first radio frequency (RF) choke acting to suppress a power surge on said data line.

16. The RF signal amplifier of claim 15, further comprising:
a third circuit path electrically connected between said data line and said ground, so that said third circuit path is in parallel to said first circuit path and in parallel to said second circuit path, and wherein said third circuit path includes a second RF choke acting to suppress a power surge on said data line.

17. The RF signal amplifier of claim 13, further comprising:
a second circuit path electrically connected between said data line and said ground, so that said second circuit path is in parallel to said first circuit path, and wherein said second circuit path includes a first radio frequency (RF) choke acting to suppress a power surge on said data line.

18. The RF signal amplifier of claim 17, further comprising:
a third circuit path electrically connected between said data line and said ground, so that said third circuit path is in parallel to said first circuit path and in parallel to said second circuit path, and wherein said third circuit path includes a second RF choke acting to suppress a power surge on said data line.

19. The RF signal amplifier of claim 11, further comprising:
an indicator to signal when said gas discharge tube is defective and can no longer operate as an open circuit.

20. A method of suppressing power surges entering a communications device comprising:
diverting a power surge from a data line through a first circuit path including a relay and a gas discharge tube in series and connected to a ground;
passing the power surge through the first circuit path until a failure of the gas discharge tube or just prior to a failure of the gas discharge tube, and then;
opening the first circuit path by changing a state of the relay to stop an electrical connection between the data line and the ground.

* * * * *